(12) United States Patent
Chen et al.

(10) Patent No.: US 12,451,435 B2
(45) Date of Patent: Oct. 21, 2025

(54) 3D STACKING ARCHITECTURE THROUGH TSV AND METHODS FORMING SAME

(71) Applicant: Taiwan Semiconductor Manufacturing Co., Ltd., Hsinchu (TW)

(72) Inventors: Hsien-Wei Chen, Hsinchu (TW); Jie Chen, New Taipei (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 568 days.

(21) Appl. No.: 17/805,036

(22) Filed: Jun. 2, 2022

(65) Prior Publication Data

US 2023/0395517 A1 Dec. 7, 2023

(51) Int. Cl.
| | |
|---|---|
| *H01L 25/065* | (2023.01) |
| *H01L 21/768* | (2006.01) |
| *H01L 23/00* | (2006.01) |
| *H01L 23/538* | (2006.01) |
| *H01L 25/10* | (2006.01) |

(52) U.S. Cl.
CPC .... *H01L 23/5386* (2013.01); *H01L 21/76898* (2013.01); *H01L 23/5385* (2013.01); *H01L 24/29* (2013.01); *H01L 24/32* (2013.01); *H01L 24/83* (2013.01); *H01L 25/0652* (2013.01); *H01L 25/105* (2013.01); *H01L 24/16* (2013.01); *H01L 24/73* (2013.01); *H01L 2224/16227* (2013.01); *H01L 2224/16237* (2013.01); *H01L 2224/29187* (2013.01); *H01L 2224/2919* (2013.01); *H01L 2224/32146* (2013.01); *H01L 2224/32225* (2013.01); *H01L 2224/73204* (2013.01); *H01L 2224/83896* (2013.01); *H01L 2924/1431* (2013.01); *H01L 2924/1432* (2013.01); *H01L 2924/1436* (2013.01); *H01L 2924/1437* (2013.01); *H01L 2924/37001* (2013.01)

(58) Field of Classification Search
CPC ............ H01L 21/486; H01L 21/76898; H01L 23/49827; H01L 23/5384; H01L 24/16; H01L 24/29; H01L 24/32; H01L 24/80; H01L 25/0652; H01L 25/105; H01L 2224/16227; H01L 2224/29187; H01L 2224/2919; H01L 2225/06541; H01L 2225/06548
USPC ......................................................... 438/667
See application file for complete search history.

(56) References Cited

U.S. PATENT DOCUMENTS

| | | | | |
|---|---|---|---|---|
| 2016/0020170 | A1* | 1/2016 | Ho .................... | H01L 21/76805 257/774 |
| 2021/0391165 | A1* | 12/2021 | Tsuji .................... | C08G 59/306 |
| 2022/0059505 | A1* | 2/2022 | Song .................... | H01L 25/0652 |

* cited by examiner

*Primary Examiner* — Hoai V Pham
(74) *Attorney, Agent, or Firm* — Slater Matsil, LLP

(57) ABSTRACT

A method includes joining a first wafer to a second wafer, forming a first through-via penetrating through the first wafer and further extending into the second wafer, and forming a redistribution line on the first wafer. The redistribution line and the first through-via electrically connect a first conductive feature in the first wafer to a second conductive feature in the second wafer. An electrical connector is formed over the first wafer.

20 Claims, 16 Drawing Sheets

3D STACKING ARCHITECTURE THROUGH TSV AND METHODS FORMING SAME

BACKGROUND

Packages of integrated circuits are becoming increasing complex, with more device dies packaged in the same package to achieve more functions. For example, a package structure has been developed to include a plurality of device dies such as processors and memory cubes in the same package. The package structure can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
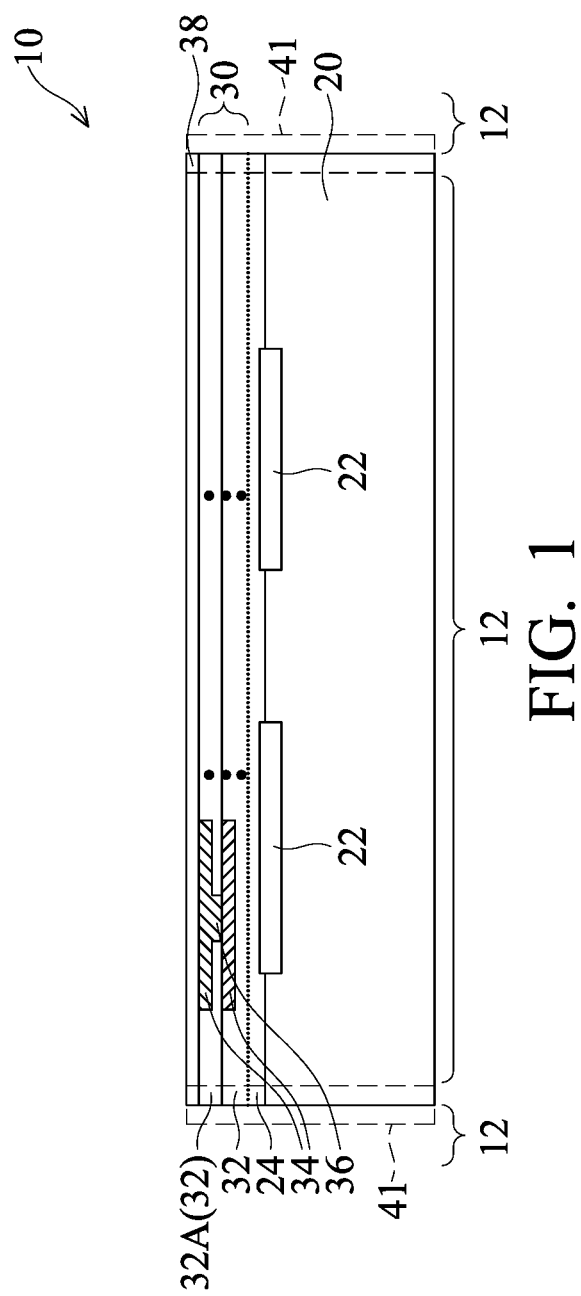
FIGS. 1-9 illustrate the cross-sectional views of intermediate stages in a packaging process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided. In accordance with some embodiments, a first package component and a second package component are joined to each other, either adhered to each other through a die-attach film, or bonded to each other through fusion bonds. Through-vias are formed to penetrate through the first package component, and to electrically couple the first package component and the second package component to each other. Accordingly, the electrical connections do not go through multiple conductive features (such as solder regions, bond pads, etc.) and interfaces. The contact resistance is reduced, and the delay in signaling is also reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 16:
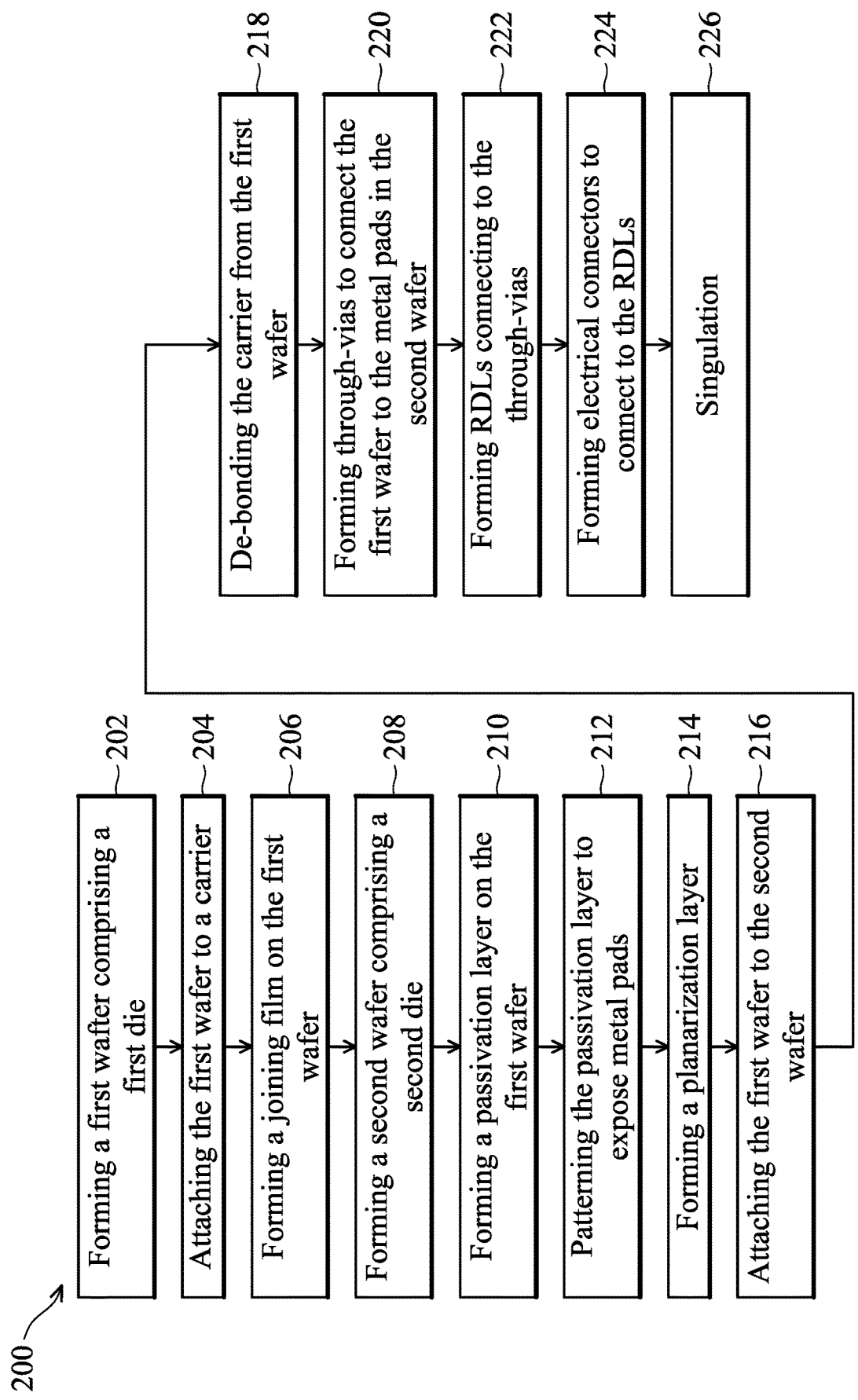
FIG. 16 illustrates a process flow for forming a package in accordance with some embodiments.

FIGS. 1 through 9 illustrate the cross-sectional views of intermediate stages in the formation of a package in accordance with some embodiments. The corresponding processes are also reflected schematically in the process flow 200 as shown in FIG. 16.

Figure 2:
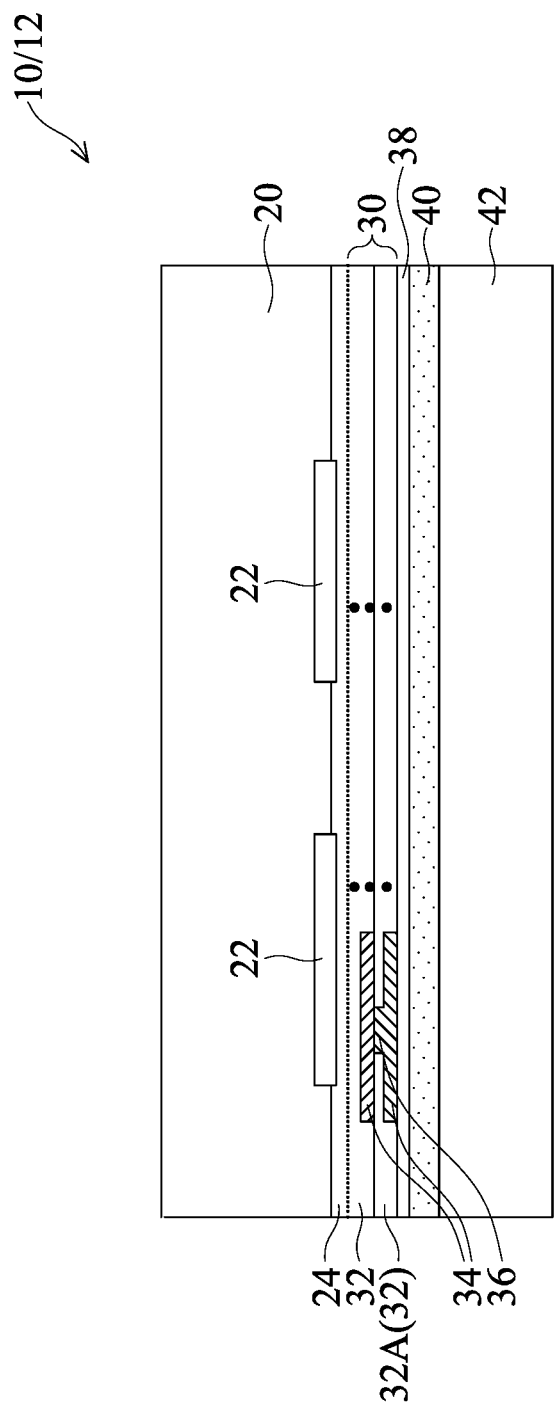
Figure 3:
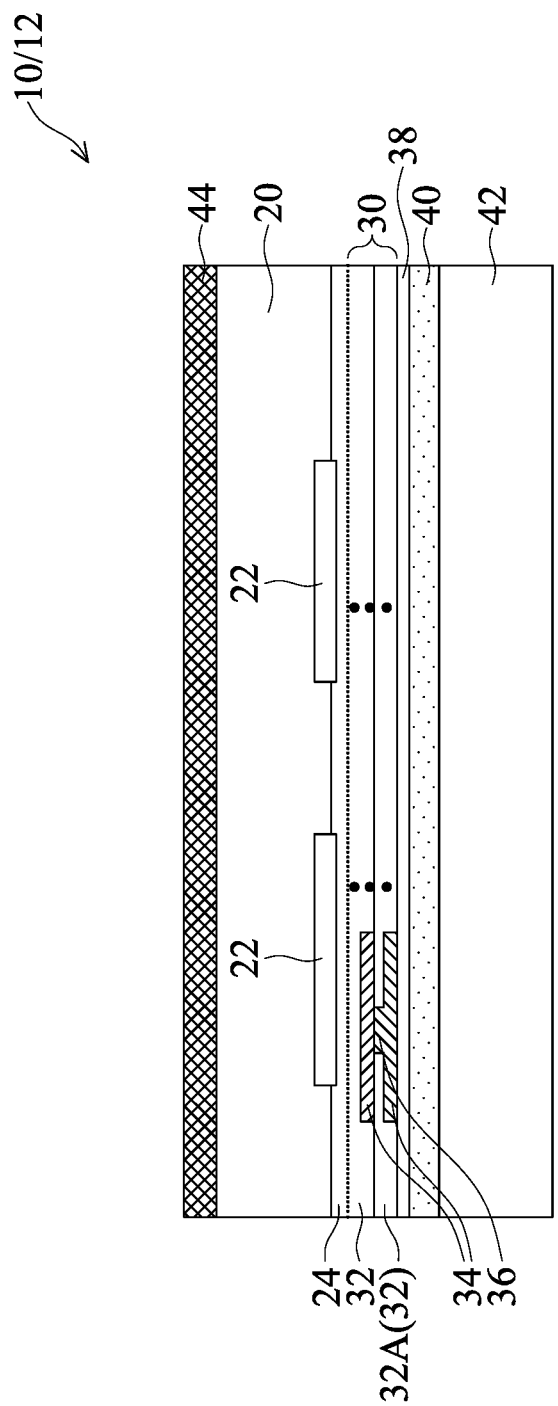

FIGS. 1 through 3 illustrate the formation of a first package component, and the preparation of the first package component for bonding. FIG. 1 illustrates the cross-sectional view in the formation of a wafer-level package component 10. The respective process is illustrated as process 202 in the process flow 200 as shown in FIG. 16. In accordance with some embodiments, package component 10 is a device wafer, which includes a plurality of device dies 12 therein, with one of example device dies 12 being illustrated. In accordance with some embodiments, device dies 12 are memory dies such as Dynamic Random-Access Memory (DRAM) dies, Static Random-Access Memory (SRAM) dies, or the like. Device dies 12 may also be logic dies, which may be Central Processing Unit (CPU) dies, Micro Control Unit (MCU) dies, BaseBand (BB) dies, Application processor (AP) dies, or the like. Device dies 12 may also be Input-output (IO) dies.

In accordance with some embodiments, package component 10 is an unsawed wafer, which includes semiconductor substrate 20 continuously extending throughout all dies in package component 10. In accordance with alternative embodiments, package component 10 is a reconstructed wafer, which includes discrete device dies and an encapsulant encapsulating the discrete device dies therein. For example, dashed regions 41 schematically illustrates the encapsulant when package component 10 comprises a reconstructed wafer. In subsequent discussion, package component 10 is referred to as wafer 10, which is illustrated as a device wafer as an example. The embodiments of the present disclosure may also be applied to other types of package components such as interposer wafers, reconstructed wafers, packages, and the like.

In accordance with some embodiments, wafer 10 includes semiconductor substrate 20 and the features formed at a top surface of semiconductor substrate 20. Semiconductor substrate 20 may be formed of or comprise crystalline silicon, crystalline germanium, crystalline silicon germanium, and/or the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20.

In accordance with some embodiments, wafer 10 includes integrated circuit devices 22, which are formed on the top surface of semiconductor substrate 20. Example integrated circuit devices 22 may include active devices such as Complementary Metal-Oxide Semiconductor (CMOS) transistors and diodes, and passive devices such as resistors, capacitors, diodes, and/or the like. The details of integrated circuit devices 22 are not illustrated herein. In accordance with alternative embodiments, wafer 10 is used for forming interposers, in which substrate 20 may be a semiconductor substrate or a dielectric substrate.

Inter-Layer Dielectric (ILD) 24 is formed over semiconductor substrate 20, and fills the space between the gate stacks of transistors (not shown) in integrated circuit devices 22. In accordance with some embodiments, ILD 24 may be formed of Phospho Silicate Glass (PSG), Boro Silicate Glass (BSG), Boron-Doped Phospho Silicate Glass (BPSG), Fluorine-Doped Silicate Glass (FSG), silicon oxide, or the like. ILD 24 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs (not shown) are formed in ILD 24, and are used to electrically connect integrated circuit devices 22 to overlying metal lines 34 and vias 36. In accordance with some embodiments, the contact plugs are formed of a conductive material selected from tungsten, aluminum, copper, titanium, tantalum, titanium nitride, tantalum nitride, alloys therefore, and/or multi-layers thereof. The formation of the contact plugs may include forming contact openings in ILD 24, filling a conductive material(s) into the contact openings, and performing a planarization (such as a Chemical Mechanical Polish (CMP) process) to level the top surfaces of the contact plugs with the top surface of ILD 24.

Interconnect structure 30 is formed over ILD 24 and the contact plugs. Interconnect structure 30 includes dielectric layers 32, and metal lines 34 and vias 36 formed in dielectric layers 32. Dielectric layers 32 are alternatively referred to as Inter-Metal Dielectric (IMD) layers 32 hereinafter. In accordance with some embodiments, at least the lower ones of dielectric layers 32 are formed of a low-k dielectric material having a dielectric constant (k-value) lower than about 3.0. Dielectric layers 32 may be formed of or comprises a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. Etch stop layers (not shown), which may be formed of aluminum nitride, aluminum oxide, silicon oxy-carbide, or the like are formed between IMD layers 32, and are not shown herein.

Metal lines 34 and vias 36 are formed in dielectric layers 32. The metal lines 34 at a same level are collectively referred to as a metal layer hereinafter. In accordance with some embodiments, interconnect structure 30 includes a plurality of metal layers that are interconnected through vias 36. Metal lines 34 and vias 36 may be formed of copper or copper alloys, and they can also be formed of other metals. The formation process may include single damascene and dual damascene processes.

Metal lines 34 include some metal lines in top dielectric layer 32A, which metal lines are referred to as top metal lines. The top metal lines 34 are also collectively referred to as being a top metal layer. The respective dielectric layer 32A may be formed of a non-low-k dielectric material such as Un-doped Silicate Glass (USG), silicon oxide, silicon nitride, or the like. Dielectric layer 32A may also be formed of a low-k dielectric material, which may be selected from the same group of candidate materials of the underlying IMD layers 32.

In accordance with some embodiments, dielectric layer 38, which is also referred to as a passivation layer, is deposited over the top metal layer. Dielectric layer 38 may be formed of silicon-containing dielectric materials such as silicon oxide, silicon nitride, silicon oxynitride, silicon oxycarbide, or the like, combinations thereof, and/or multi-layers thereof. In accordance with some embodiments, dielectric layer 38 comprises an etch stop layer, and another dielectric layer over the etch stop layer. In accordance with some embodiments, the etch stop layer comprises silicon nitride, while it may also have a composite structure. For example, the composite etch stop layer may include an aluminum nitride layer, a silicon oxy-carbide layer over the aluminum nitride layer, and an aluminum oxide layer over the silicon oxy-carbide layer. The dielectric layer over the etch stop layer may be formed of or comprises silicon oxide, silicon oxynitride, silicon carbide, or the like.

In accordance with some embodiments in which wafer 10 is a reconstructed wafer (rather than an un-sawed device wafer), an encapsulant, which is represented by dashed regions 41, separates device dies 12 from each other. Encapsulant 41 may comprise a molding compound, a molding underfill, or the like. Encapsulant 41 may comprise a base material, and filler particles in the base material. The base material may be formed of or comprises a polymer, an epoxy, a resin, and/or the like. The filler particles may be the dielectric particles of $SiO_2$, $Al_2O_3$, silica, or the like, and may have spherical shapes. Also, the spherical filler particles may have the same or different diameters. In accordance with some embodiments, the top surface and the bottom surface of encapsulant 41 are coplanar with the top surface and the bottom surface of device dies 12. Encapsulant 41 may form a grid pattern separating device dies 12 from each other, with device dies 12 being in the grid.

Referring to FIG. 2, wafer 10 is flipped upside down, and is attached to release film 40, which is further formed on carrier 42. The respective process is illustrated as process 204 in the process flow 200 as shown in FIG. 16. Carrier 42 may be a glass carrier, an organic carrier, or the like. In accordance with some embodiments, release film 40 may be formed of a polymer-based material (such as a Light-To-Heat-Conversion (LTHC) material), which may be decomposed when subject to heat. In accordance with alternative embodiments, film 40 is a bond film formed of a silicon-containing dielectric material such as silicon oxide, silicon nitride, silicon oxynitride, or the like, and carrier 42 may be a silicon wafer. Accordingly, the bond film may be bonded to dielectric layer 38 through fusion bonding, with Si—O—Si bonds being formed.

In a subsequent process, a backside grinding process is performed on semiconductor substrate 20, so that semiconductor substrate 20 is thinned. For example, the thickness of the thinned semiconductor substrate 20 may be in the range between about 3 μm and about 10 μm. The backside grinding process may be performed through a Chemical Mechanical Polish (CMP) process or a mechanical grinding process.

Referring to FIG. 3, joining film 44 is formed on the back surface of substrate 20. The respective process is illustrated as process 206 in the process flow 200 as shown in FIG. 16. In accordance with some embodiments, joining film 44 is an adhesive film, which has the function of adhering the features on opposite sides of joining film 44 together. Joining film 44 is alternatively referred to as a Die-Attach Film (DAF) in accordance with these embodiments. In accordance with some embodiments, joining film 44 comprises an organic material, which may comprise a polymer. Joining film 44 may comprise epoxy, resin, or the like. In accordance with some embodiments, joining film 44 comprises an inorganic material such as silicon oxide, silicon nitride, silicon oxynitride, and the like. In accordance with some embodiments, joining film 44 may be pre-formed, and the pre-formed joining film 44 is adhered to wafer 10. In accordance with alternative embodiments, joining film 44 is formed on wafer 10, for example, through a coating process, with the joining film 44 being coated when in a flowable form. There may be, or may not be, a curing process (such as a thermal-setting process) after the coating.

In accordance with alternative embodiments, joining film 44 is formed of or comprises a silicon-containing (inorganic) dielectric material, which may include silicon and additional elements such as carbon, nitrogen, oxygen, and the like, and combinations thereof. The example materials of joining film 44 may include silicon oxide, silicon oxynitride (SiON), silicon nitride (SiN), silicon oxy-carbo-nitride (SiOCN), silicon carbon-nitride (SiCN), silicon oxy-carbide (SiOC), silicon carbide (SiC), or the like. The formation process may include Atomic Layer Deposition (ALD), Chemical Vapor Deposition (CVD), Plasma Enhanced Chemical Vapor Deposition (PECVD), or the like.

Figure 4:
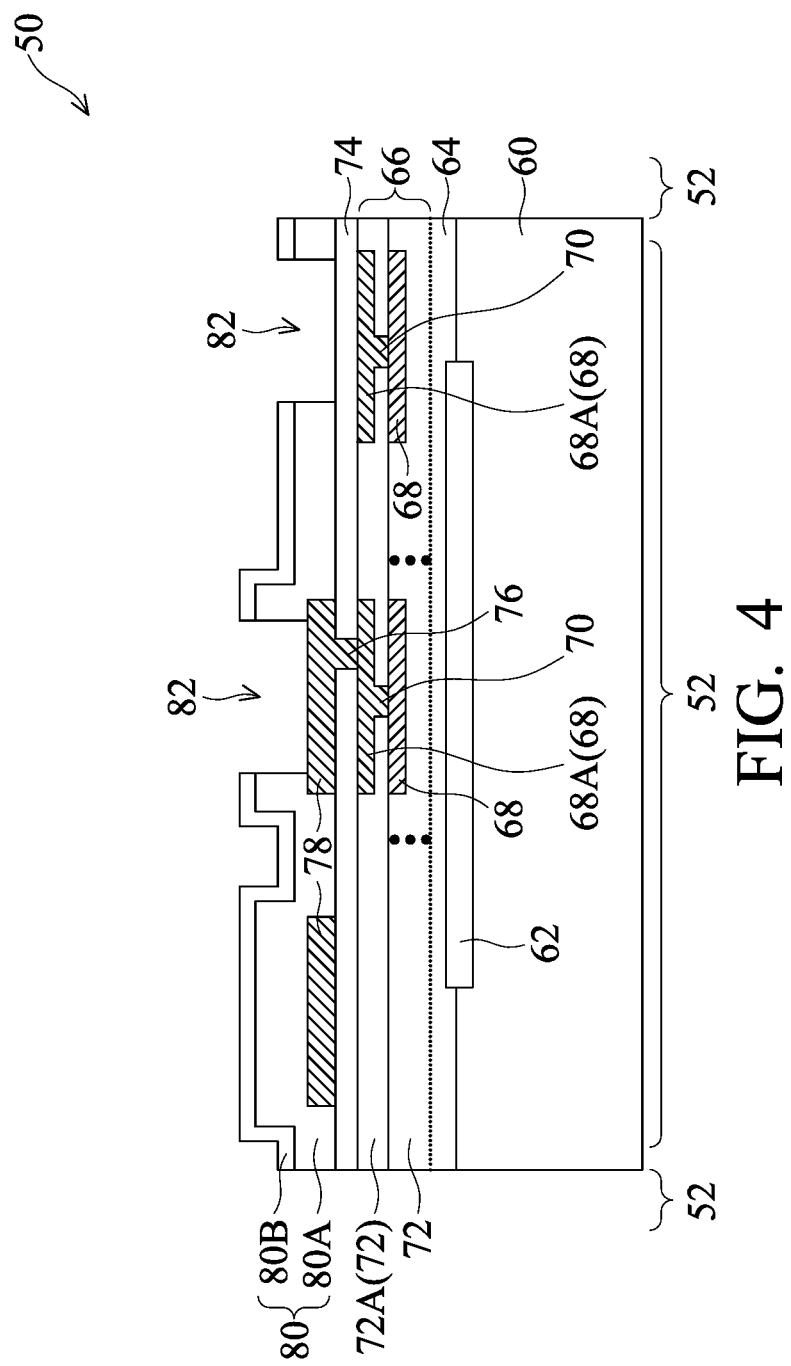
Figure 5:
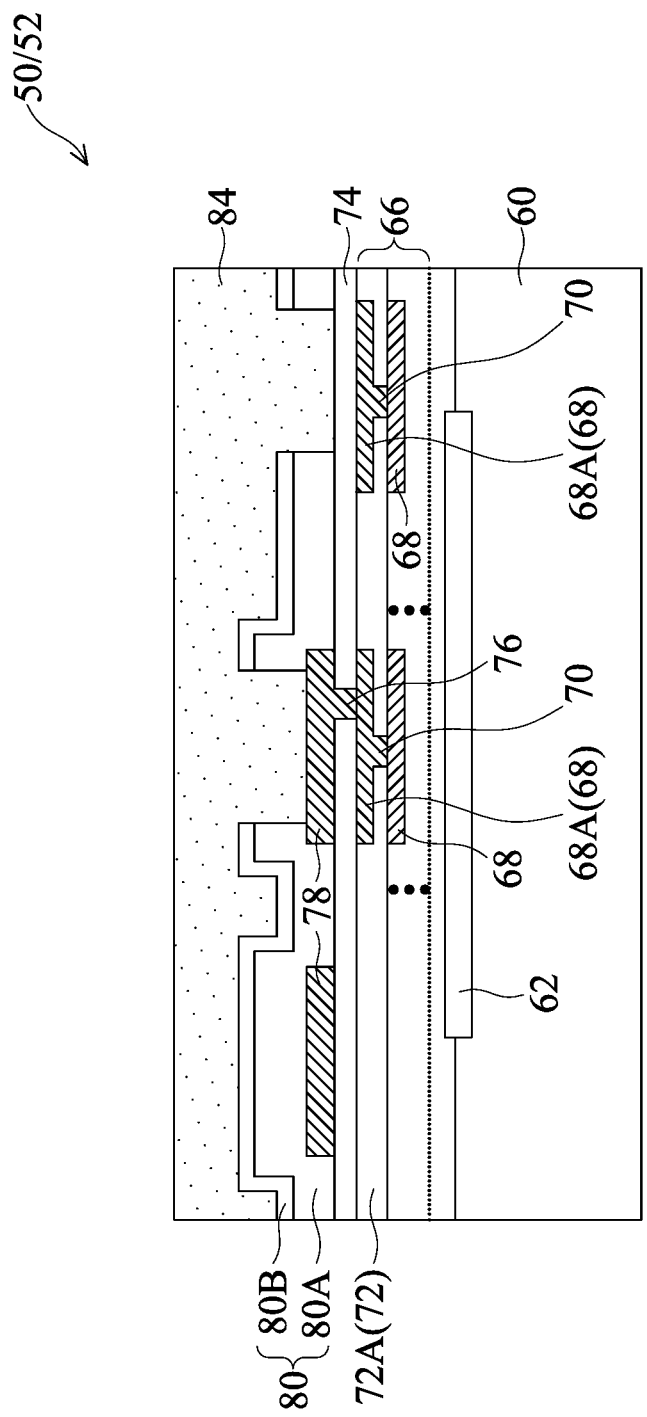

FIGS. 4 and 5 illustrate the formation of a second package component, and the preparation of the first package component for bonding. FIG. 4 illustrates the cross-sectional view in the formation of wafer-level package component 50. The respective process is illustrated as process 208 in the process flow 200 as shown in FIG. 16. In accordance with some embodiments, package component 50 is an unsawed device wafer, which include a plurality of device dies 52 therein, with one of device dies 52 being illustrated. In accordance with alternative embodiments, package component 50 is or may include a reconstructed wafer. In accordance with some embodiments, device dies 52 are logic dies such as CPU dies, MCU dies, BaseBand (BB) dies, AP dies, or the like. Device dies 52 may also include memory dies such as DRAM dies, SRAM dies, or the like.

In accordance with some embodiments in which package component 50 is or comprises an unsawed wafer, package component 50 includes semiconductor substrate 60 continuously extending throughout all dies 52 in package component 50. In accordance with alternative embodiments, package component 50 is or comprises a reconstructed wafer, which includes discrete device dies 52 and an encapsulant (not shown) encapsulating the discrete device dies 52 therein. In subsequent discussion, package component 50 is referred to as wafer 50, which is illustrated using a device wafer as an example.

Semiconductor substrate 60 may be formed of crystalline silicon, crystalline germanium, crystalline silicon germanium, and/or the like. Semiconductor substrate 60 may also be a bulk silicon substrate or an SOI substrate. In accordance with some embodiments, wafer 50 includes integrated circuit devices 62, which are formed on the top surface of semiconductor substrate 60. Example integrated circuit devices 62 may include active devices such as CMOS transistors and diodes, and passive devices such as resistors, capacitors, diodes, and/or the like. The details of integrated circuit devices 62 are not illustrated herein.

ILD 64 is formed over semiconductor substrate 60, and fills the space between the gate stacks of transistors (not shown) in integrated circuit devices 62. The material of ILD 64 may be selected from the same group of candidate materials for forming ILD 24 (FIG. 1). Contact plugs (not shown) are formed in ILD 64. Interconnect structure 66 is formed over ILD 64 and the contact plugs. Interconnect structure 66 includes dielectric layers 72, and metal lines 68 and vias 70 formed in dielectric layers 72. The structures and formation processes of these features may be similar to the structures and the formation processes of corresponding features in wafer 10 in accordance with some embodiments.

Metal lines 68 include some metal lines in top dielectric layer 72 (denoted as 72A), which metal lines are referred to as top metal lines 68A. The top metal lines 68A are also collectively referred to as being a top metal layer. The respective dielectric layer 72A may be formed of a non-low-k dielectric material such as USG, silicon oxide, silicon nitride, or the like, or multi-layers thereof.

Passivation layer 74 (sometimes referred to as passivation-1 or pass-1) is formed over interconnect structure 66. In accordance with some embodiments, passivation layer 74 is formed of a non-low-k dielectric material having a dielectric constant equal to or greater than the dielectric constant of silicon oxide. Passivation layer 74 may be formed of or comprise an inorganic dielectric material, which may include a material selected from, and is not limited to, silicon nitride, silicon oxide, silicon oxy-nitride, silicon oxy-carbide, silicon carbo-nitride, or the like, combinations thereof, and/or multi-layers thereof.

Passivation layer 74 is patterned in an etching process to form openings (occupied by vias 76). The etching process may include a dry etching process, which includes forming a patterned etching mask (not shown) such as a patterned photoresist, and then etching passivation layer 74. The patterned etching mask is then removed, and metal lines/pads 68A are exposed through the corresponding openings.

Next, vias 76 and conductive features 78 (also referred to as metal pads hereinafter) are formed. Vias 76 extend into the openings in passivation layer 74, and metal pads 78 are formed over passivation layer 74. In accordance with some embodiments, the formation of metal pads 78 and vias 76 includes a plating process, which may include depositing a metal seed layer, forming a patterned plating mask (not shown) over the metal seed layer, and plating vias 76 and metal pads 78 in the openings in the patterned plating mask. The patterned plating mask is then removed, followed by an etching process to remove exposed portions of the metal seed layer. In accordance with alternative embodiments, the formation of vias 76 and metal pads 78 includes a deposition process (such as a Physical Vapor Deposition (PVD) process), followed by a patterning process through etching. Metal pads 78 and vias 76 may include aluminum copper, copper, aluminum, nickel, tungsten, or the like, or alloys thereof. In accordance with alternative embodiments, metal pads 78 and vias 76 comprise copper, and are free from aluminum.

Passivation layer 80 is deposited over metal pads 78 and passivation layer 74. The respective process is illustrated as process 210 in the process flow 200 as shown in FIG. 16. In accordance with some embodiments, passivation layer 80 is formed of or comprises an inorganic dielectric material, which may include, and is not limited to, silicon nitride, silicon oxide, silicon oxy-nitride, silicon oxy-carbide, or the like, combinations thereof, and/or multi-layers thereof. For example, passivation layer 80 may include a silicon nitride layer as an etch stop layer, a silicon oxide layer over the etch stop layer, and another silicon nitride layer over the silicon oxide layer. FIG. 4 schematically illustrates two layers, wherein layer 80A may include a silicon oxide layer, and layer 80B may include a silicon nitride layer. The deposition of passivation layer 80 may be performed through a conformal deposition process(es) such as ALD, CVD, or the like.

Passivation layer 80 is patterned through an etching process(es) to form openings 82, for example, through a photolithography process. The respective process is illustrated as process 212 in the process flow 200 as shown in FIG. 16. Some metal pads 78 are thus exposed. In accordance with some embodiments, passivation layer 74 (rather than metal pads 78) are exposed to some of openings 82. In accordance with alternative embodiments, no portion of passivation layer 74 is exposed through any opening, and all openings 82 overlap metal pads 78.

Referring to FIG. 5, planarization layer 84 is formed. The respective process is illustrated as process 214 in the process flow 200 as shown in FIG. 16. In accordance with some embodiments, planarization layer 84 is formed of or may comprise an inorganic dielectric material, which may be a silicon-containing dielectric material such as $SiO_2$, SiOC, SiON, SiOCN, SiCN, or the like. In accordance with alternative embodiments, planarization layer 84 is formed of or comprises a polymer, which may be formed of or comprises polyimide, polybenzoxazole (PBO), or the like. A planarization process such as a CMP process or a mechanical polishing process is then performed, so that the top surface of planarization layer 84 is planar.

Figure 6:
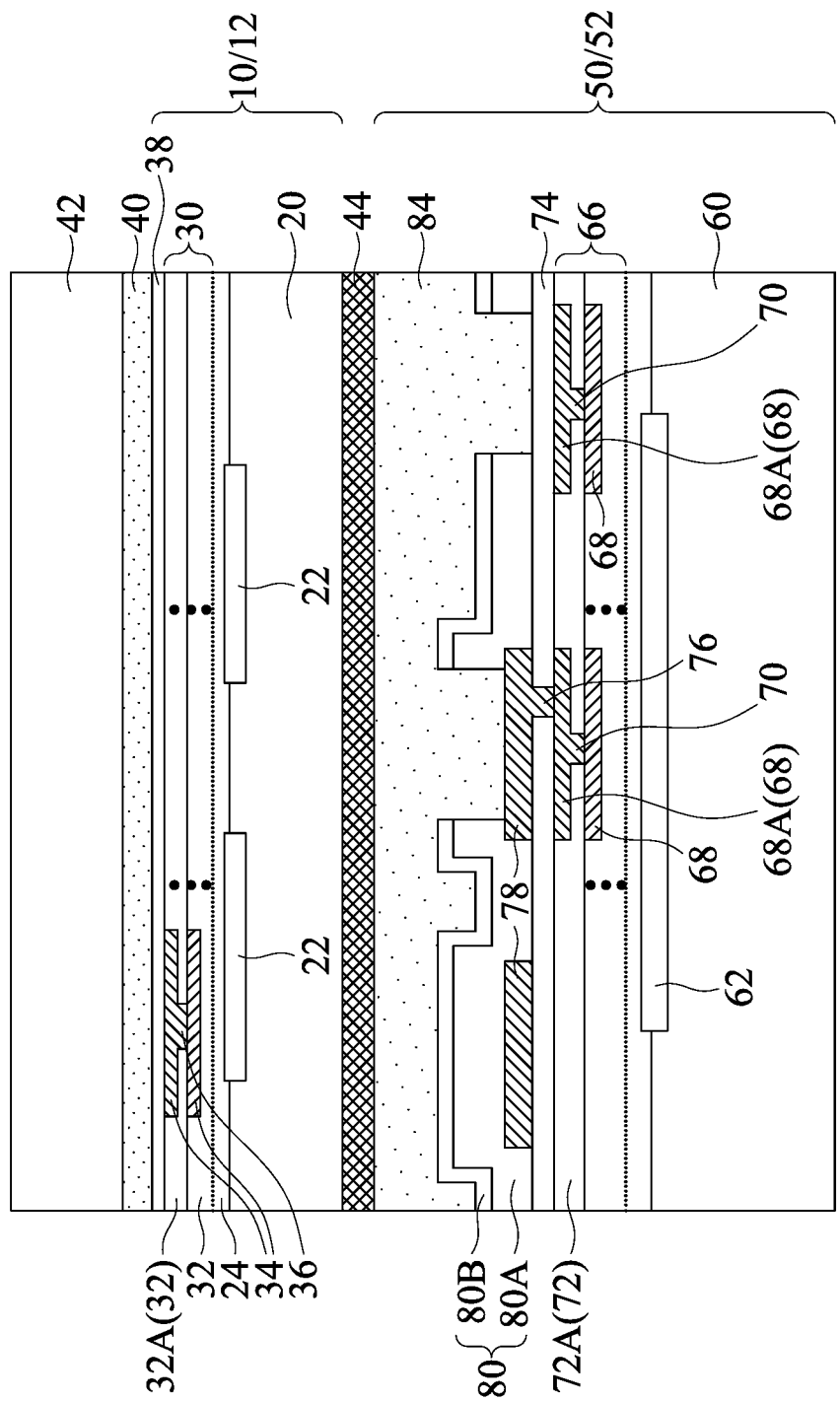

FIG. 6 illustrates the joining (which may be through adhesion or fusion bonding) of wafer 10 to wafer 50. The respective process is illustrated as process 216 in the process flow 200 as shown in FIG. 16. The joining may be a face-to-back joining, with the front side (the face) of wafer 50 being joined to the backside of wafer 10.

In accordance with some embodiments in which joining film 44 is an adhesive film such as a DAF, the joining of joining film 44 to planarization layer 84 is through adhesion. In accordance with these embodiments, planarization layer 84 may be formed of or comprise an inorganic material or an organic material, as discussed in preceding paragraphs. In accordance with some embodiments, after the adhesion of wafer 10 to wafer 50 through the adhesive joining film 44, a thermal setting process may be performed to thermally set (cure) joining film 44. In accordance with alternative embodiments, during the entire process starting from the time wafers 10 and 50 have been joined and ending at a time the process shown in FIG. 8 has been performed, no thermal setting process is performed.

In accordance with alternative embodiments, the joining is performed through a bonding process, wherein joining film 44 is bonded to planarization layer 84 through fusion bonding. In which embodiments, both of joining film 44 and planarization layer 84 may be formed of or comprise the silicon-containing dielectric materials such as $SiO_2$, SiOC, SiON, SiOCN, SiCN, or the like, as discussed in preceding paragraphs. Accordingly, Si—O—Si bonds are formed to join joining film 44 with planarization layer 84. In accordance with alternative embodiments, joining film 44 is not formed, and semiconductor substrate 20 in wafer 10 is bonded directly (and physically) to planarization layer 84 through fusion bonding, again forming Si—O—Si bonds.

Figure 7:
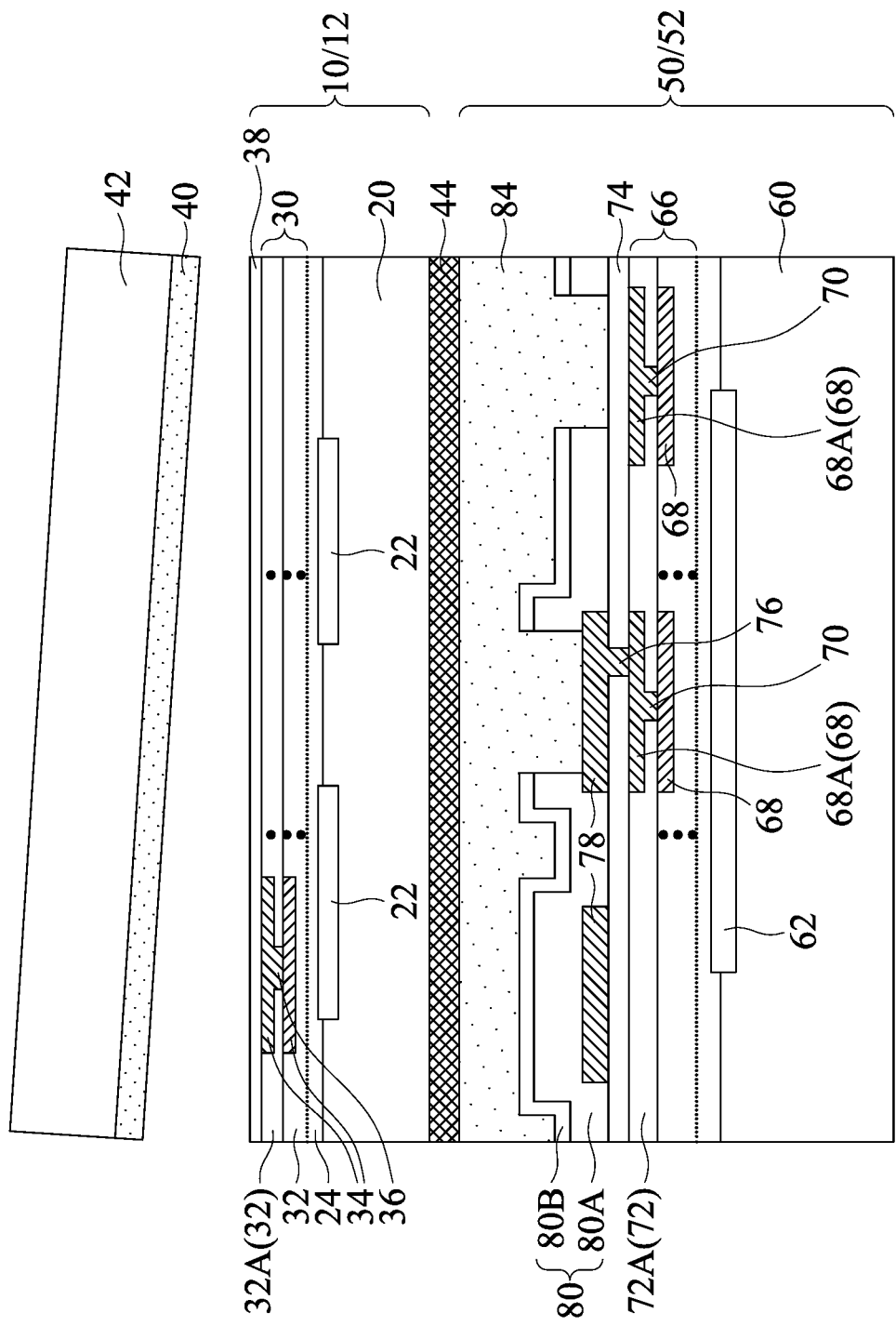

Referring to FIG. 7, carrier 42 is released from wafer 10, for example, by projecting laser on release film 40 in order to decompose release film 40, so that reconstructed wafer 10 may be separated from carrier 42. The respective process is illustrated as process 218 in the process flow 200 as shown in FIG. 16. In accordance with alternative embodiments in which film 40 is a bond film bonded to substrate 20 through fusion bonding, carrier 42 and bond film 40 may be removed through a mechanical polishing.

Figure 8:
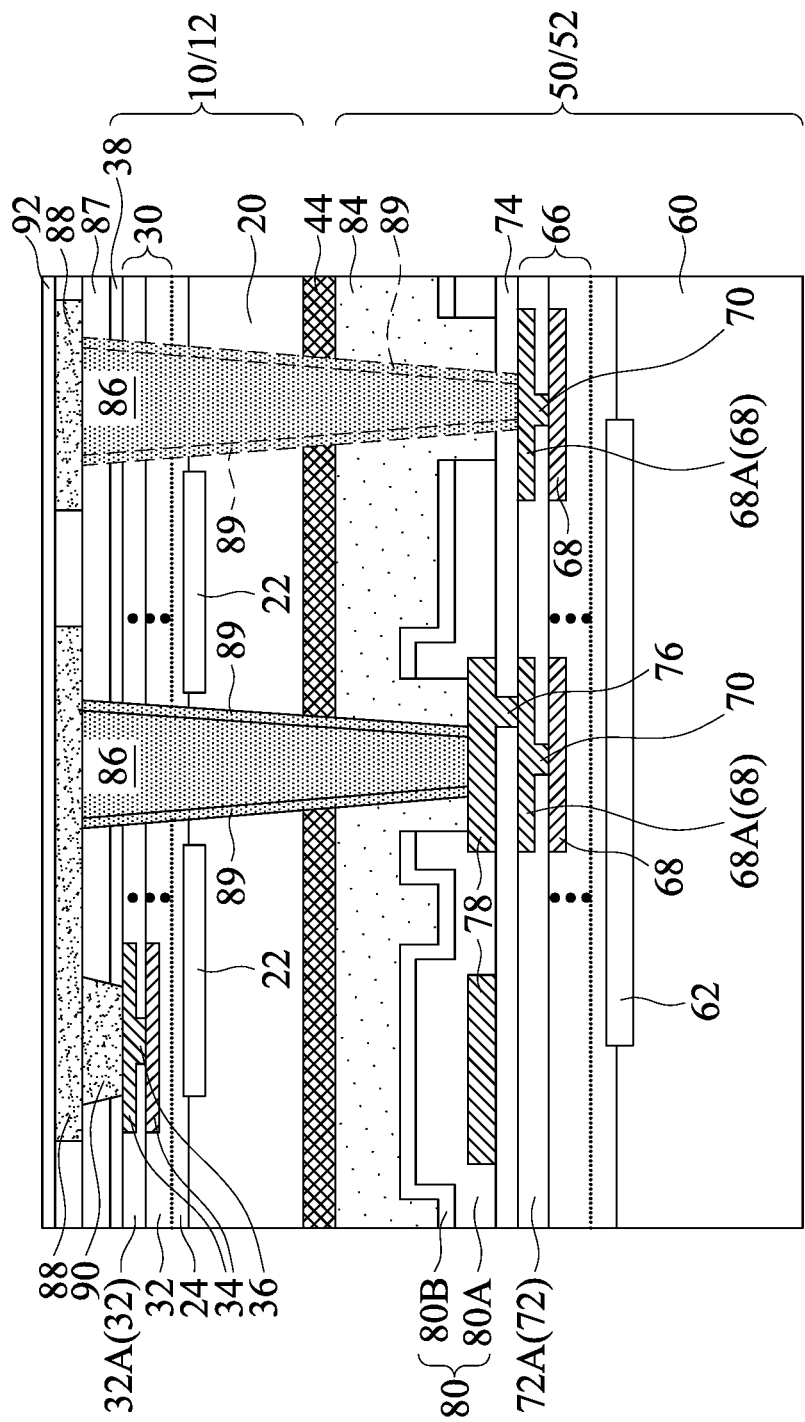

Referring to FIG. 8, through-vias 86 are formed to electrically and signally connect wafer 10 with wafer 50. In accordance with some embodiments, the formation of through-vias 86 may comprise depositing dielectric layer 87 on wafer 10, etching-through dielectric layer 87 and wafer 10, and then etching planarization layer 84 in wafer 50, so that metal pads 78 are exposed. The etching is stopped on the top surface of metal pads 78. In accordance with some embodiments in which planarization layer 84 extends into passivation layer 80 to contact passivation layer 74, some of the openings formed by the etching process penetrate through passivation layer 74, so that metal pads 68A are exposed. In accordance with alternative embodiments, none of the metal pads 68 are exposed after the etching process.

Through-vias 86 are then formed. The respective process is illustrated as process 220 in the process flow 200 as shown in FIG. 16. The formation process includes depositing a conformal dielectric isolation layer 89 lining the openings, performing an anisotropic etching process to remove the horizontal portions of dielectric isolation layer 89 (thus reveal metal pads 78 and 68A again), and filling the openings with a conductive material. The conductive material may include tungsten, copper or the like. A planarization process is then performed to remove excess portions of the conductive material, forming through-vias 86, which are separated from the surrounding parts of wafers 10 and 50 by the dielectric isolation layer 89. In accordance with some embodiments, some of through-vias 86 penetrate through passivation layer 74 to contact metal pads 68A. These through-vias 86 are shown using dashed lines to indicate that these through-vias may be, or may not be, formed. In accordance with alternative embodiments, none of through-vias 86 penetrate through passivation layer 74 to contact metal pads 68A.

Redistribution lines (RDLs) 88 and vias 90 are also formed, so that the metal lines/pads 34 in wafers 10 and the metal lines/pads 78/68A in wafer 50 are electrically interconnected through through-vias 86, RDLs 88, and vias 90. The respective process is illustrated as process 222 in the process flow 200 as shown in FIG. 16. Dielectric layer 92 is then formed to cover RDLs 88.

Figure 9:
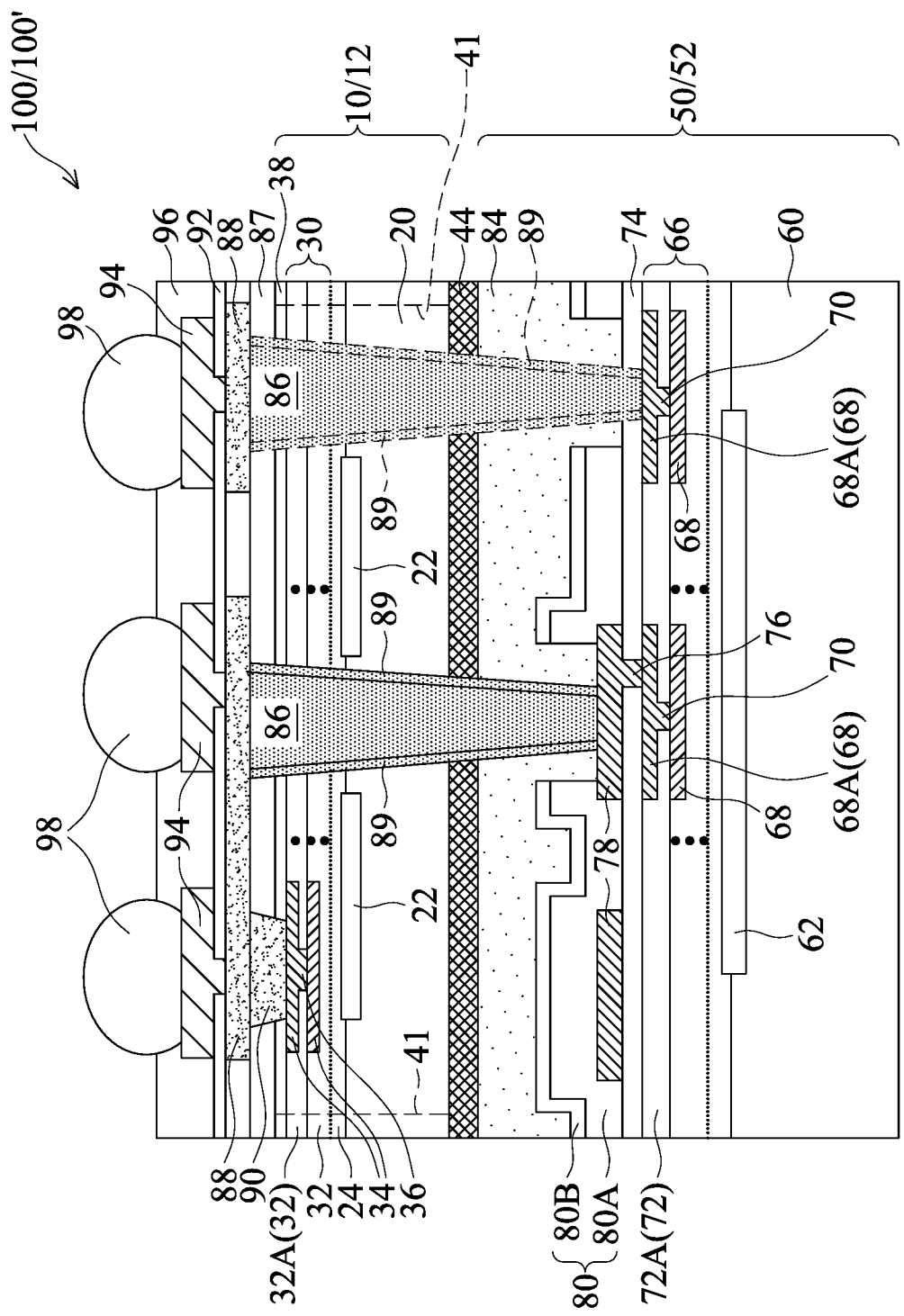

FIG. 9 illustrates the formation of Under-Bump Metallurgies (UBMs) 94 and electrical connectors 98 in accordance with some embodiments. To form UBMs 94, dielectric layer 92 is formed (using a polymer or an inorganic dielectric material), and openings are formed in dielectric layer 92 to expose the underlying metal pads, which are parts of RDLs 88 in the illustrative embodiments. UBMs 94 are then formed, for example, through plating. UBMs 94 may be formed of or comprise nickel, copper, titanium, or multi-layers thereof.

Dielectric layer 96 and electrical connectors 98 are then formed on UBMs 94. The respective process is illustrated as process 224 in the process flow 200 as shown in FIG. 16. The formation of electrical connectors 98 may include depositing and patterning dielectric layer 96, placing solder balls on the exposed portions of UBMs 94, and then reflowing the solder balls, and hence electrical connectors 98 include solder regions. In accordance with alternative embodiments of the present disclosure, the formation of electrical connectors 98 includes performing a plating process to form solder layers, and then reflowing the solder layers. Electrical connectors 98 may also include non-solder metal pillars, or metal pillars and solder caps over the non-solder metal pillars, which may also be formed through plating. Throughout the description, the structure including wafers 10 and 50 is referred to as reconstructed wafer 100.

In accordance with some embodiments, reconstructed wafer 100 is placed on a dicing tape (not shown), which is attached to a frame (not shown). Reconstructed wafer 100 is then singulated in a die-saw process, for example, using a blade, so that reconstructed wafer 100 is separated into discrete packages 100'. The respective process is illustrated as process 226 in the process flow 200 as shown in FIG. 16. Each of discrete packages 100' includes a device die 12 from the sawed wafer 10 and a device die 52 from the sawed wafer 50.

In accordance with alternative embodiments, reconstructed wafer 100 is not sawed, and is used at wafer level. For example, in high-computing applications such as Artificial Intelligence (AI) applications, reconstructed wafer 100 is further packaged without being sawed. At a time the reconstructed wafer 100 is used (powered up), reconstructed wafer 100 may remain as being a whole, and is unsawed.

As shown in FIG. 9, the signal and electrical communication between device dies 12 and 52 is through through-vias 86, which are in direct connection with the features (such as metal lines/pad) in device dies 12 and 52. No bonding through solder, metal pads, micro-bumps, or the like, is used. Accordingly, the communication paths are short, and the number of interfaces formed between device dies 12 and 52 is reduced. As a comparison, if device dies 12 and 52 are bonded to each other through solder regions, metal pads, micro-bumps or the like, there are more interfaces formed, and contact resistance is increased. The communication paths may also be longer.

Figure 10:
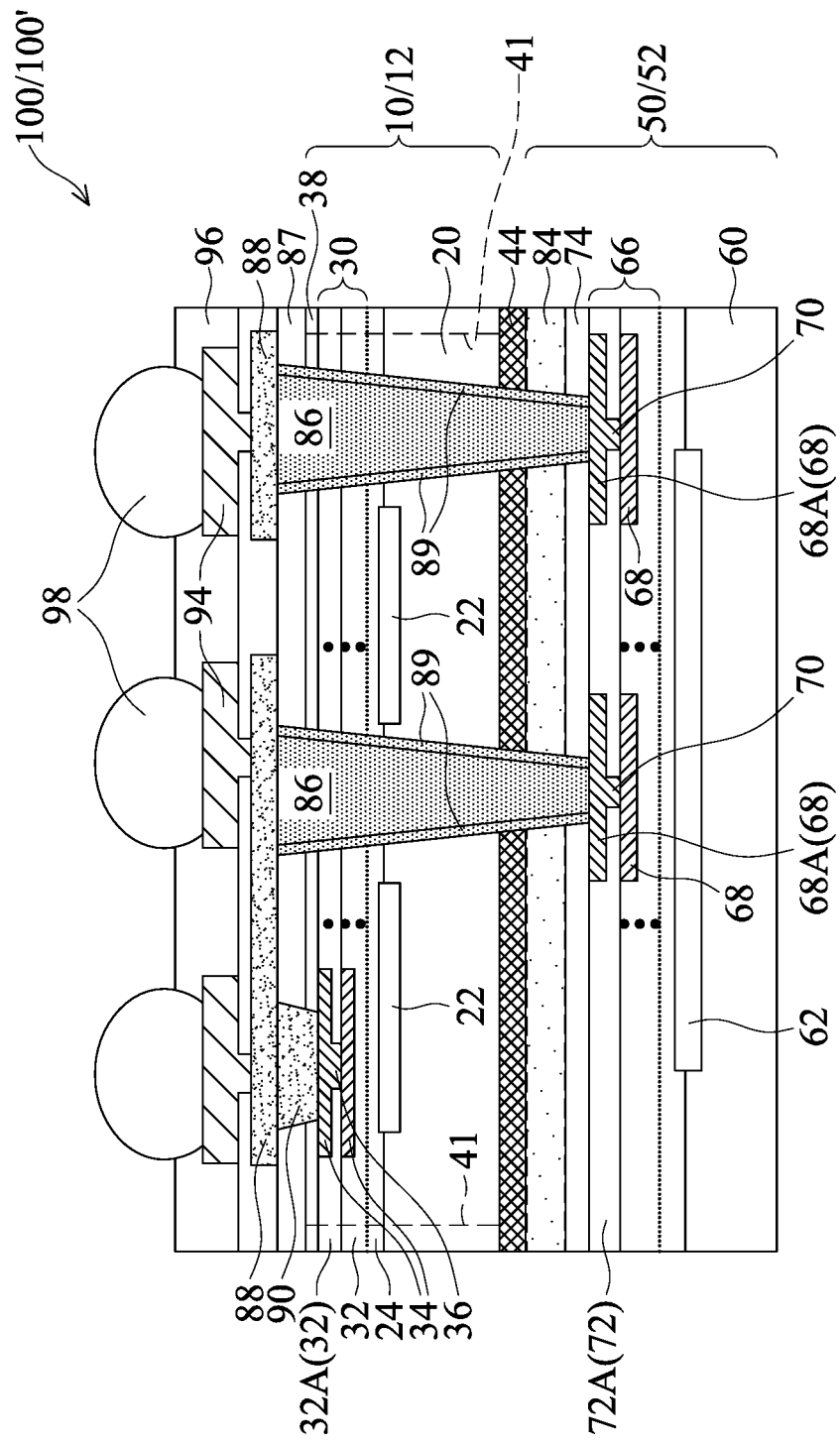
FIGS. 10 and 11 illustrate the cross-sectional views of some packages in accordance with some embodiments.
Figure 11:
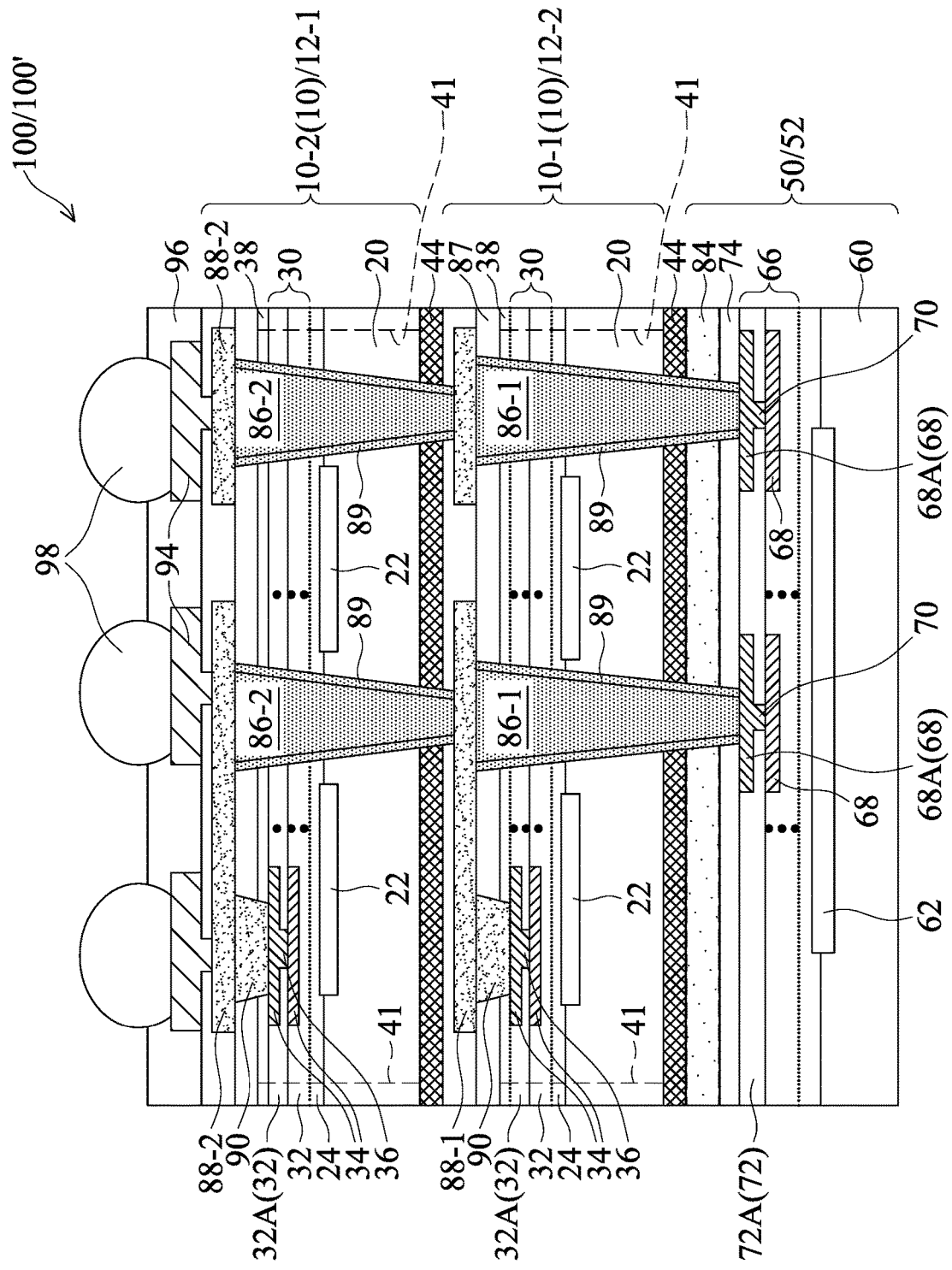

FIGS. 10 and 11 illustrate the reconstructed wafers 100 and packages 100' in accordance with alternative embodiments. Unless specified otherwise, the materials and the formation processes of the wafers 100 and packages 100' in these embodiments are essentially the same as the like components denoted by like reference numerals in the preceding embodiments shown in FIGS. 1 through 9. The details regarding the formation processes and the materials of the components shown in FIGS. 10 and 11 may thus be found in the discussion of the preceding embodiments.

FIG. 10 illustrates an embodiment in which through-vias 86 are all in contact with the metal pads 68A in the top dielectric layer 72A, and no metal pads 78 (as in FIG. 9) are formed. In accordance with some embodiments, the top surfaces of dielectric layer 72A are coplanar with the top surface of metal pads 68A. Passivation layer 74 is thus a planar layer. Accordingly, the planarization layer 84 may be, or may not be, formed, and is shown as being dashed.

FIG. 11 illustrates an embodiment in which there are a plurality of tiers of wafers 10 (with wafers 10-1 and 10-2 illustrated as an example). Although two wafers and the corresponding device dies 12-1 and 12-2 are illustrated, there may be more tiers stacked. In accordance with some embodiments, through-vias 86-1, 86-2 and the like are formed, and are interconnected through RDLs 88-1, 88-2, and the like, so that the electrical connections from the top die 12-1 to the bottom die 52 has fewer interfaces, and the contact resistance in the electrical paths is reduced. This embodiment may be used for the stacking of memory stacks.

Figure 12:
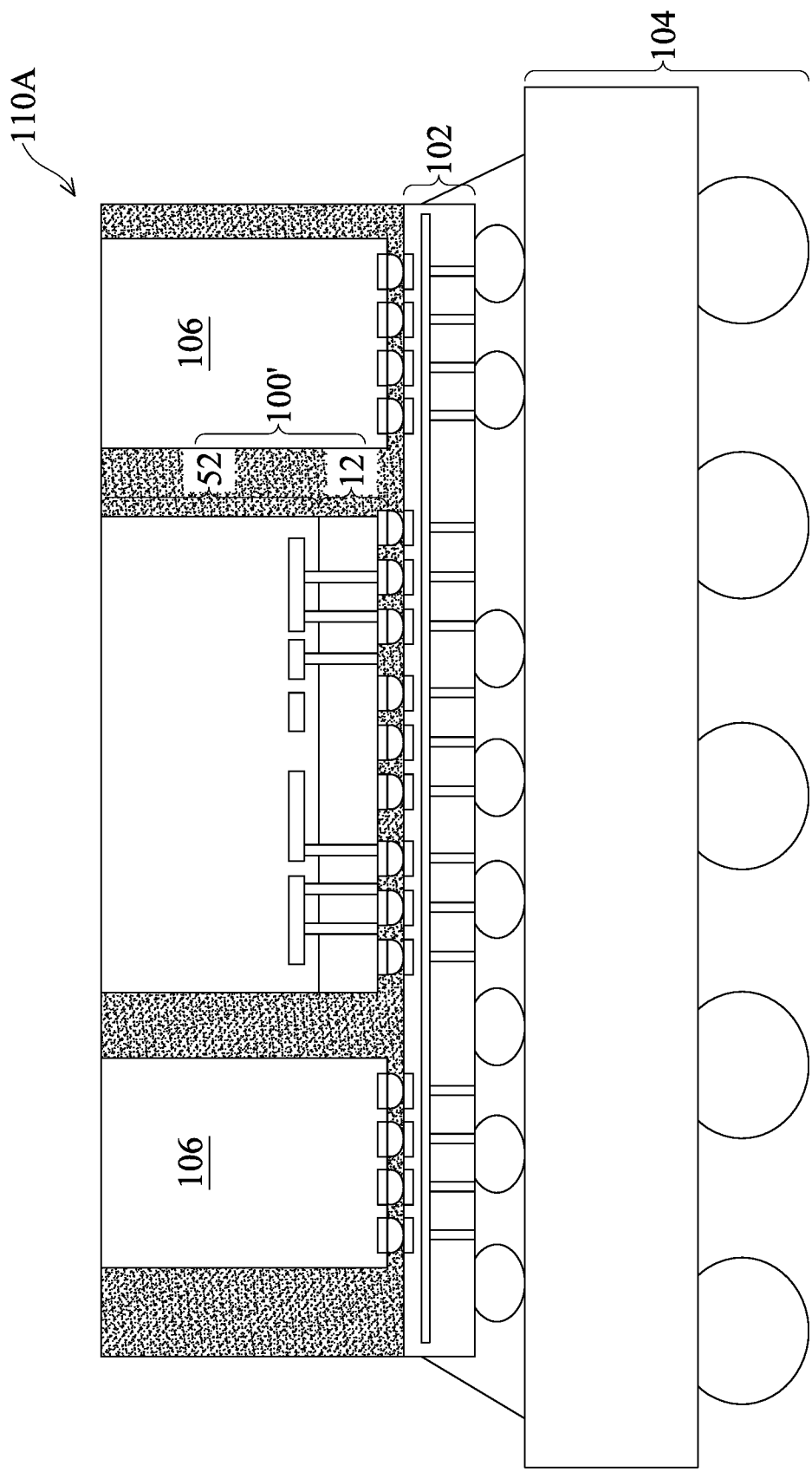
FIGS. 12-15 illustrate the cross-sectional views of some packages in accordance with some embodiments.

The packages 100' as formed in accordance with the embodiments of the present disclosure may be used in various packages, as shown in FIGS. 12 through 15. FIG. 12 illustrates package 110A, which includes package 100' bonded to package component 102, which is further bonded to package component 104. Package component 102 may be a device die, a package, an interposer, or the like. Package component 104 may be a package substrate, a printed circuit board, or the like. Additional package components 106 may be bonded to package component 102. The resulting package 110A may be a Chip-on-Wafer-on-Substrate (CoWoS) package.

Figure 13:
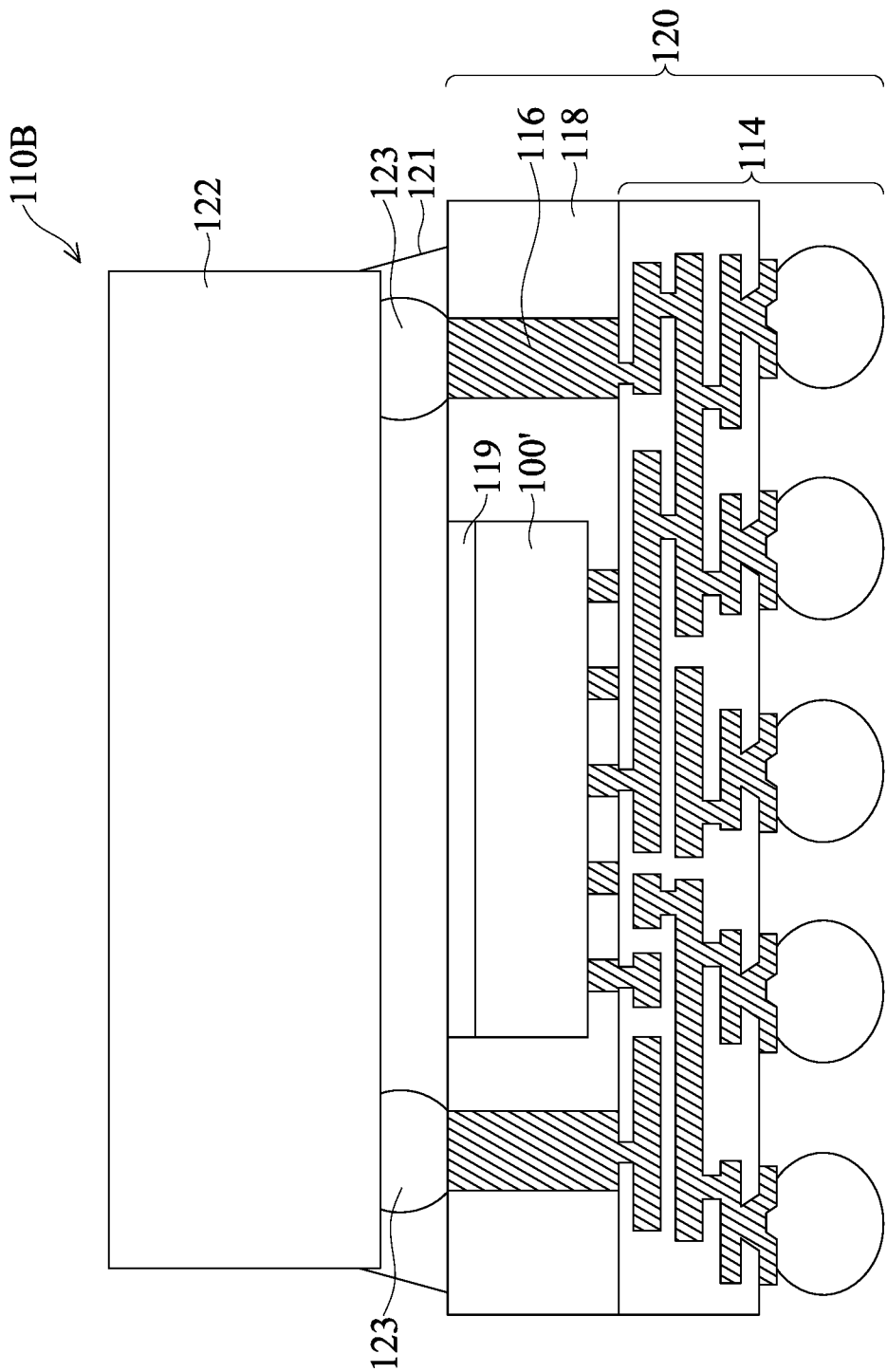

FIG. 13 illustrates package 110B including package 100' therein. Package 110B may be a fanout package, wherein package 100' and through-vias 116 are encapsulated in encapsulant 118, which may be a molding compound. Interconnect structure 114 is formed layer-by-layer based on package 100', through-vias 116, and encapsulant 118, so that bottom package (fanout package) 120 is formed. Top package component 122 is bonded to bottom package 120 to form package 110B. Die-attach film is in encapsulant 118. Underfill 121 is used to encapsulate solder regions 123.

Figure 14:
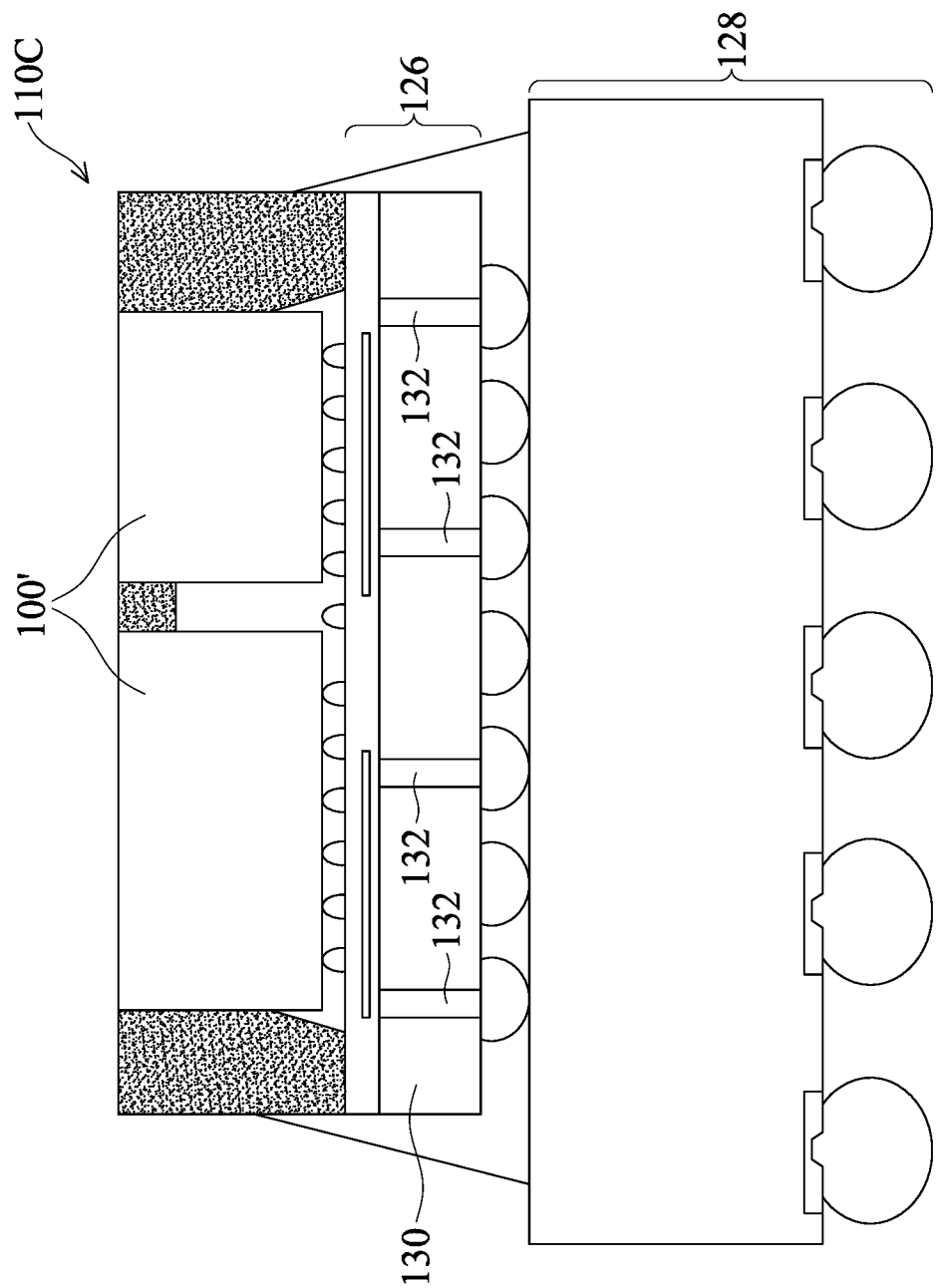

FIG. 14 illustrates a CoWoS package 110C, which includes packages 100' bonded to silicon interposer 126. The silicon interposer 126 includes semiconductor substrate 130, which may be a silicon substrate, and through-vias 132 penetrating through the semiconductor substrate 130. Interposer 126 is further bonded to package component 128, which may be a package substrate, a printed circuit board, or the like.

Figure 15:
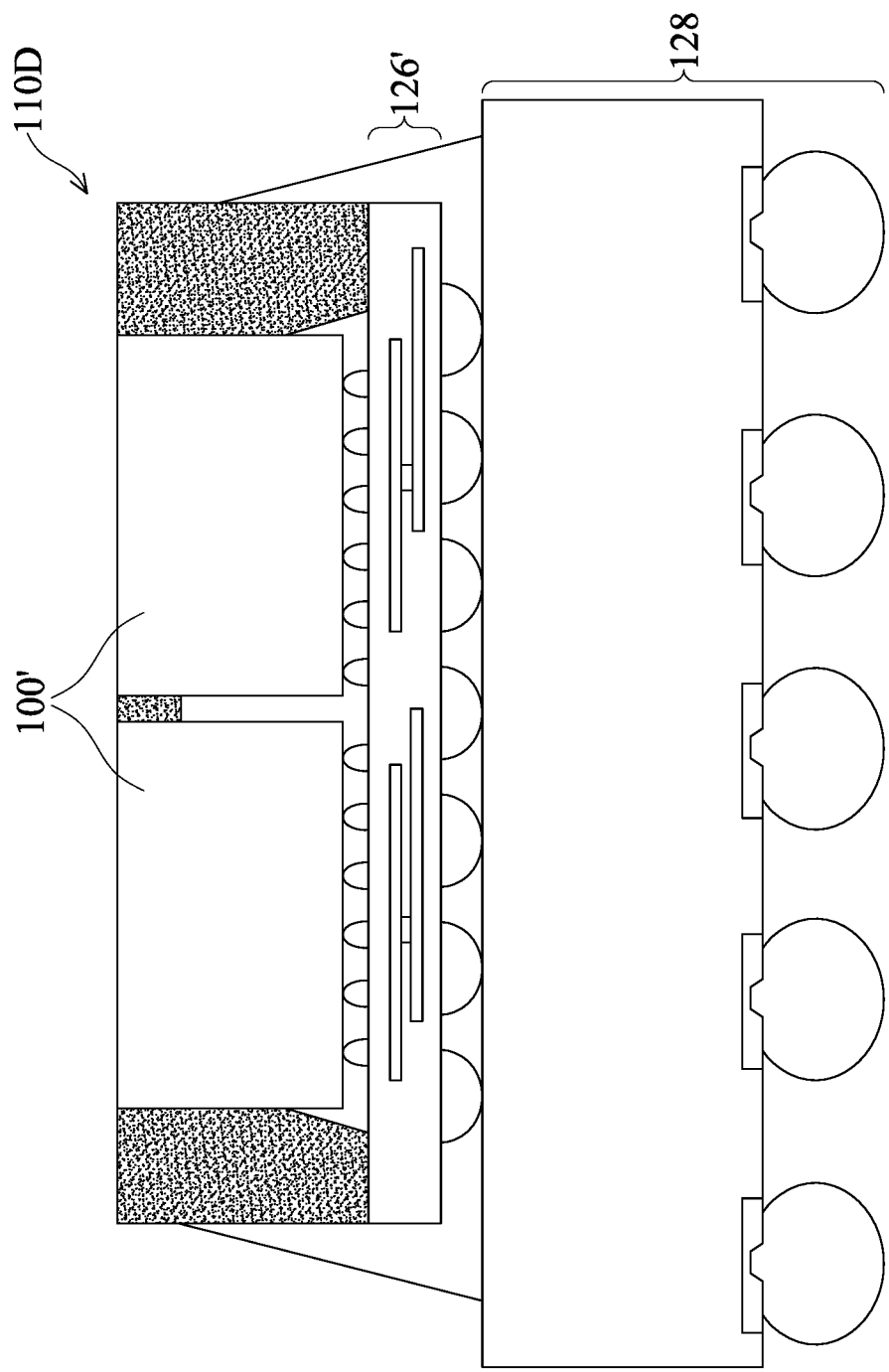

FIG. 15 illustrates a CoWoS package 110D based on an organic interposer, wherein packages 100' are bonded to organic interposer 126'. Organic interposer 126' includes organic dielectric layers and redistribution lines in the organic dielectric layers. Interposer 126' is further bonded to package component 128, which may be a package substrate, a printed circuit board, or the like.

In above-illustrated embodiments, some processes and features are discussed in accordance with some embodiments to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By adhering or bonding device dies together, and forming through-vias to penetrate through one of the device dies to contact the metal pads in the other device die, the electrical paths connecting the two device dies include fewer interfaces. The contact resistance is thus reduced. The electrical paths are also shorter, resulting in lower signal delay.

In accordance with some embodiments, a method comprises joining a first wafer to a second wafer; forming a first through-via penetrating through the first wafer and further extending into the second wafer; forming a redistribution line on the first wafer, wherein the redistribution line and the first through-via electrically connect a first conductive feature in the first wafer to a second conductive feature in the second wafer; and forming an electrical connector over the first wafer. In an embodiment, the method further comprises adhering a die-attach film to the first wafer, wherein the first wafer and the second wafer are joined to each other through the die-attach film. In an embodiment, the die-attach film comprises an organic material, and wherein the adhering the die-attach film to the first wafer comprises adhesion. In an embodiment, the method further comprises pre-forming the die-attach film, wherein the pre-formed die-attach film is adhered to the first wafer.

In an embodiment, the forming the first through-via comprises etching through the first wafer, the die-attach film, and a portion of the second wafer to form an opening; and the method further comprises filling the opening with a conductive material to form the first through-via. In an embodiment, the method further comprises depositing a silicon-containing dielectric layer on the first wafer, wherein the joining the first wafer to the second wafer comprises bonding the silicon-containing dielectric layer to the second wafer through fusion bonding. In an embodiment, the method further comprises forming a first passivation layer over a first metal pad in the second wafer; and depositing a planarization layer on the second wafer, wherein the planarization layer comprises a portion extending into the first passivation layer to contact the first metal pad, and wherein the first wafer is bonded to the planarization layer. In an embodiment, the first through-via penetrates through the portion of the planarization layer to contact the first metal pad.

In an embodiment, the first metal pad is over a second passivation layer that is underlying the first passivation layer, and wherein the method further comprises forming a second through-via penetrating through the first wafer and further extending into the second wafer, wherein the second through-via penetrates through the second passivation layer to land on a second metal pad that is underlying the second passivation layer. In an embodiment, the method further comprises sawing the first wafer and the second wafer into a plurality of packages, with each of the plurality of packages comprising a first die in the first wafer and a second die in the second wafer. In an embodiment, the method further comprises after the redistribution line is formed, joining a third wafer to the first wafer; and forming a second through-via penetrating through the third wafer, wherein the second through-via is electrically connected to the first through-via. In an embodiment, a backside of the first wafer is joined to a face side of the second wafer.

In accordance with some embodiments, a structure comprises a first device die comprising a first semiconductor substrate; a first interconnect structure over the first semiconductor substrate; and a first metal pad over the first semiconductor substrate; a second device die over and attached to the first device die, wherein the second device die comprises a second semiconductor substrate over the first interconnect structure; a second interconnect structure over the second semiconductor substrate; and a second metal pad over the second semiconductor substrate; and a through-via penetrating through the second device die and further extending into the first device die, wherein the through-via electrically interconnects the first metal pad and the second metal pad. In an embodiment, a first dielectric layer in the first device die is bonded to a second dielectric layer in the second device die through fusion bonds. In an embodiment, the structure further comprises an adhesive film between the first device die and the second device die, wherein the adhesive film adheres the first device die to the second device die. In an embodiment, the adhesive film comprises an organic material. In an embodiment, the adhesive film comprises a polymer.

In accordance with some embodiments, a structure comprises a first device die comprising a first passivation layer; a metal pad over the first passivation layer; a second passivation layer over and contacting both of the first passivation layer and the metal pad; and a planarization layer comprising a first portion extending into the second passivation layer to contact the metal pad, and a second portion over the second passivation layer; a die-attach film over and the contacting the planarization layer; a second device die over and adhered to the die-attach film; and a first through-via penetrating through the second device die, wherein the first through-via further penetrates through the first portion of the planarization layer to contact the metal pad. In an embodiment, the planarization layer comprises a planar top surface and a non-planar bottom surface. In an embodiment, the structure further comprises a second through-via penetrating through the second device die, wherein the second through-via further penetrates through the second portion of the planarization layer and a dielectric layer underlying the planarization layer to contact an additional metal pad in the first device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first wafer and a second wafer;
   forming a first passivation layer over a first metal pad of the second wafer;
   depositing a planarization layer on the second wafer and as a top part of the second wafer, wherein the planarization layer comprises a portion extending into the first passivation layer to contact the first metal pad;
   joining the first wafer to the second wafer, wherein the first wafer is joined to the planarization layer of the second wafer;
   forming a first through-via penetrating through the first wafer and further extending into the second wafer;
   forming a redistribution line on the first wafer, wherein the redistribution line and the first through-via electrically connect a first conductive feature in the first wafer to a second conductive feature in the second wafer; and
   forming an electrical connector over the first wafer.

2. The method of claim 1 further comprising adhering a die-attach film to the first wafer, wherein the first wafer and the second wafer are joined to each other through the die-attach film.

3. The method of claim 2, wherein the die-attach film comprises an organic material, and wherein the adhering the die-attach film to the first wafer comprises adhesion.

4. The method of claim 2 further comprising pre-forming the die-attach film, wherein the pre-formed die-attach film is adhered to the first wafer.

5. The method of claim 2, wherein the forming the first through-via comprises etching through the first wafer, the die-attach film, and a portion of the second wafer to form an opening; and the method further comprises:
   filling the opening with a conductive material to form the first through-via.

6. The method of claim 1 further comprising:
depositing a silicon-containing dielectric layer on the first wafer, wherein the joining the first wafer to the second wafer comprises bonding the silicon-containing dielectric layer to the second wafer through fusion bonding.

7. The method of claim 1, wherein the first through-via penetrates through the portion of the planarization layer to contact the first metal pad.

8. The method of claim 1, wherein the first metal pad is over a second passivation layer that is underlying the first passivation layer, and wherein the method further comprises:
forming a second through-via penetrating through the first wafer and further extending into the second wafer, wherein the second through-via penetrates through the second passivation layer to land on a second metal pad that is underlying the second passivation layer.

9. The method of claim 1 further comprising sawing the first wafer and the second wafer into a plurality of packages, with each of the plurality of packages comprising a first die in the first wafer and a second die in the second wafer.

10. The method of claim 1 further comprising:
after the redistribution line is formed, joining a third wafer to the first wafer; and
forming a second through-via penetrating through the third wafer, wherein the second through-via is electrically connected to the first through-via.

11. The method of claim 1, wherein a backside of the first wafer is joined to a face side of the second wafer.

12. The method of claim 1 further comprising, after the planarization layer is deposited on the second wafer, performing a planarization process on the planarization layer.

13. A method comprising:
forming a first device die comprising:
forming a first interconnect structure over a first semiconductor substrate; and
forming a first metal pad over the first semiconductor substrate;
attaching a second device die to the first device die, wherein the second device die comprises:
a second semiconductor substrate over the first interconnect structure;
a second interconnect structure over the second semiconductor substrate; and
a second metal pad over the second semiconductor substrate; and
forming a through-via penetrating through the second device die and further extending into the first device die, wherein the through-via electrically interconnects the first metal pad and the second metal pad.

14. The method of claim 13, wherein the attaching comprises bonding a first dielectric layer in the first device die to a second dielectric layer in the second device die through fusion bonding.

15. The method of claim 13, wherein the first device die is attached to the second device die through an adhesive film.

16. The method of claim 15, wherein the adhesive film comprises an organic material.

17. The method of claim 15, wherein the adhesive film comprises a polymer.

18. A method comprising:
forming a first device die comprising:
a first passivation layer;
a metal pad over the first passivation layer;
a second passivation layer over and contacting both of the first passivation layer and the metal pad; and
a planarization layer comprising a first portion extending into the second passivation layer to contact the metal pad, and a second portion over the second passivation layer;
adhering a second device die over the first device die, wherein the second device die is adhered to the first device die through a die-attach film; and
forming a first through-via penetrating through the second device die, wherein the first through-via further penetrates through the first portion of the planarization layer to contact the metal pad.

19. The method of claim 18, wherein the planarization layer comprises a planar first surface and a non-planar second surface, wherein the non-planar second surface is opposite to the planar first surface.

20. The method of claim 18 further comprising forming a second through-via penetrating through the second device die, wherein the second through-via further penetrates through the second portion of the planarization layer and a dielectric layer underlying the planarization layer to contact an additional metal pad in the first device die.

* * * * *